(12) United States Patent
Zhang et al.

(10) Patent No.: US 10,290,684 B2
(45) Date of Patent: May 14, 2019

(54) ARRAY SUBSTRATE, DISPLAY PANEL AND DISPLAY APPARATUS HAVING THE SAME, AND FABRICATING METHOD THEREOF

(71) Applicant: BOE TECHNOLOGY GROUP CO., LTD., Beijing (CN)

(72) Inventors: Feng Zhang, Beijing (CN); Zhen Liu, Beijing (CN); Jing Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 39 days.

(21) Appl. No.: 15/520,554

(22) PCT Filed: Oct. 11, 2016

(86) PCT No.: PCT/CN2016/101791
§ 371 (c)(1),
(2) Date: Apr. 20, 2017

(87) PCT Pub. No.: WO2017/161862
PCT Pub. Date: Sep. 28, 2017

(65) Prior Publication Data
US 2018/0083070 A1    Mar. 22, 2018

(30) Foreign Application Priority Data
Mar. 25, 2016    (CN) .......................... 2016 1 0178511

(51) Int. Cl.
*H01L 27/32* (2006.01)
*H01L 27/12* (2006.01)
(Continued)

(52) U.S. Cl.
CPC ...... *H01L 27/322* (2013.01); *G02F 1/133509* (2013.01); *G02F 1/133514* (2013.01);
(Continued)

(58) Field of Classification Search
CPC ............. H01L 27/322; H01L 27/14621; H01L 27/1262; H01L 27/3244; G02F 1/133514;
(Continued)

(56) References Cited

U.S. PATENT DOCUMENTS

2009/0284696 A1    11/2009  Cheong et al.
2011/0079782 A1 *   4/2011  Kim .................. G02F 1/133516
                                                                257/59

(Continued)

FOREIGN PATENT DOCUMENTS

CN    101256246 A    9/2008
CN    102103222 A    6/2011
(Continued)

OTHER PUBLICATIONS

Third Office Action in the Chinese Patent Application No. 201610178511.1, dated Feb. 12, 2018; English translation attached.
(Continued)

*Primary Examiner* — Thanhha S Pham
(74) *Attorney, Agent, or Firm* — Intellectual Valley Law, P.C.

(57) ABSTRACT

The present application discloses an array substrate having a subpixel region and an inter-subpixel region, a display panel and a display apparatus having the same, and a fabricating method thereof. The array substrate includes a plasmonic color filter layer including a plurality of color filter blocks in the subpixel region on a base substrate. Each of the plurality of color filter blocks includes a plurality of plasmonic nanostructures made of a semiconductor material. A first color filter block corresponding to a subpixel of a first color has an arrangement of nanostructures different from that of a second color filter block corresponding to a subpixel of a second color; the second color being different from the first color.

20 Claims, 6 Drawing Sheets

(51) Int. Cl.
*G02F 1/133* (2006.01)
*G02F 1/1335* (2006.01)
*G02F 1/1362* (2006.01)

(52) U.S. Cl.
CPC ...... *H01L 27/1262* (2013.01); *H01L 27/3244* (2013.01); *G02F 2001/133521* (2013.01); *G02F 2001/136222* (2013.01); *G02F 2203/10* (2013.01); *H01L 2227/323* (2013.01)

(58) Field of Classification Search
CPC ... G02F 1/133509; G02F 2001/136222; G02F 2003/10; G02B 5/008; G02B 6/1226
See application file for complete search history.

(56) References Cited

U.S. PATENT DOCUMENTS

| | | |
|---|---|---|
| 2011/0128405 A1 | 6/2011 | Handa |
| 2011/0151605 A1 | 6/2011 | Yoon |
| 2017/0176650 A1* | 6/2017 | Govorov ............... G02B 5/008 |

FOREIGN PATENT DOCUMENTS

| | | |
|---|---|---|
| CN | 102257410 A | 11/2011 |
| CN | 103149616 A | 6/2013 |
| KR | 101308079 B1 | 9/2013 |

OTHER PUBLICATIONS

International Search Report & Written Opinion dated Jan. 16, 2017, regarding PCT/CN2016/101791.

Yu et al., Transmissive/Reflective Structural Color Filters: Theory and Applications; Journal of Nanomaterials; vol. 2014, Article ID 212637, Jul. 15, 2014.

Yoon et al., Color filter incorporating a subwavelength patterned grating in poly silicon; Optics Express; vol. 16, 2374-2380, Feb. 5, 2008.

First Office Action in the Chinese Patent Application No. 201610178511.1, dated May 5, 2017; English translation attached.

First Office Action in the Chinese Patent Application No. 201610178511.1, dated Oct. 23, 2017; English translation attached.

* cited by examiner

FIG. 1

*Related Art*

ARRAY SUBSTRATE, DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application N. PCT/CN2016/101791, filed Oct. 11, 2016, which claims priority to Chinese Patent Application No. 201610178511.1, filed Mar. 25, 2016, the contents of which are incorporated by reference in the entirety.

TECHNICAL FIELD

The present invention relates to display technology, more particularly, to an array substrate, a display panel and a display apparatus having the same, and a fabricating method thereof.

BACKGROUND

Typically, a display panel such as a liquid crystal display panel and an organic light emitting display panel, includes an array substrate and a counter substrate. The array substrate includes various semiconductor elements of the display panel, e.g., a thin film transistor. The counter substrate typically includes a color filter substrate having multiple color filters for filtering light transmitted through the color filters, resulting in light of different colors for color display. A conventional color filter typically includes a light absorptive material that is capable of absorbing light of one frequency range but largely transmits light of a different frequency range. Examples of light absorptive materials include various organic dyes.

SUMMARY

In one aspect, the present invention provides an array substrate having a subpixel region and an inter-subpixel region, comprising a plasmonic color filter layer comprising a plurality of color filter blocks in the subpixel region on a base substrate; wherein each of the plurality of color filter blocks comprises a plurality of plasmonic nanostructures made of a semiconductor material; and a first color filter block corresponding to a subpixel of a first color has an arrangement of nanostructures different from that of a second color filter block corresponding to a subpixel of a second color; the second color being different from the first color.

Optionally, the plurality of plasmonic nanostructures in each of the plurality of color filter blocks have a periodic arrangement of repeating plasmonic nanostructures.

Optionally, the plurality of plasmonic nanostructures are made of polycrystalline silicon.

Optionally, the plurality of plasmonic nanostructures are made of polycrystalline silicon doped with a dopant.

Optionally, at least one of the plurality of color filter blocks comprises an array of plasmonic nanostructures having an array pitch and nanostructure size; light configured to transmitted through the first color filter block has a first wavelength; light configured to transmitted through the second color filter block has a second wavelength; the first wavelength being larger than the second wavelength; an array of plasmonic nanostructures in the first color filter block has a first array pitch and a first nanostructure size; an array of plasmonic nanostructures in the second color filter block has a second array pitch and a second nanostructure size; the first array pitch is larger than the second array pitch; and the first nanostructure size is larger than the second nanostructure size.

Optionally, a cross-section along a direction substantially parallel to the base substrate of each of the plurality of plasmonic nanostructures has a shape selected from the group consisting of a circular shape, an elliptical shape, a square, and a regular polygon.

Optionally, the plasmonic color filter layer comprises a red color filter block corresponding to a red subpixel, a green color filter block corresponding to the green subpixel, and a blue color filter block corresponding to the blue subpixel; an array of plasmonic nanostructures in the red color filter block has an array pitch in a range of approximately 340 nm to approximately 360 nm, and a nanostructure size in a range of approximately 165 nm to approximately 185 nm; an array of plasmonic nanostructures in the green color filter block has an array pitch in a range of approximately 230 nm to approximately 250 nm, and a nanostructure size in a range of approximately 110 nm to approximately 130 nm; and an array of plasmonic nanostructures in the blue color filter block has an array pitch in a range of approximately 200 nm to approximately 220 nm, and a nanostructure size in a range of approximately 95 nm to approximately 115 nm.

Optionally, the array of plasmonic nanostructures in the red color filter block has an array pitch of approximately 350 nm, and a nanostructure size of approximately 175 nm; the array of plasmonic nanostructures in the green color filter block has an array pitch of approximately 240 nm, and a nanostructure size of approximately 120 nm; and the array of plasmonic nanostructures in the blue color filter block has an array pitch of approximately 210 nm, and a nanostructure size of approximately 105 nm.

Optionally, a cross-section along a direction substantially parallel to the base substrate of each of the plurality of plasmonic nanostructures has a circular shape; and the nanostructure size is a nanostructure diameter of the circular shape.

Optionally, a cross-section along a direction substantially parallel to the base substrate of each of the plurality of plasmonic nanostructures has a square shape; and the nanostructure size is a nanostructure width of the square shape.

Optionally, at least one of the plurality of color filter blocks has a grating structure comprising a plurality of rows of rectangular plasmonic nanostructures; the grating structure having a grating pitch, each of the plurality of rows of rectangular plasmonic nanostructures having a nanostructure width; light configured to transmitted through the first color filter block has a first wavelength; light configured to transmitted through the second color filter block has a second wavelength; the first wavelength being larger than the second wavelength; a grating structure in the first color filter block has a first grating pitch and a first nanostructure width; a grating structure in the second color filter block has a second grating pitch and a second nanostructure width; the first grating pitch is larger than the second grating pitch; and the first nanostructure width is larger than the second nanostructure width.

Optionally, the plasmonic color filter layer comprises a red color filter block corresponding to a red subpixel, a green color filter block corresponding to the green subpixel, and a blue color filter block corresponding to the blue subpixel; a grating structure in the red color filter block has a grating pitch in a range of approximately 340 nm to approximately 360 nm, and a nanostructure width in a range of approximately 165 nm to approximately 185 nm; a grating structure in the green color filter block has a grating pitch in a range of approximately 230 nm to approximately 250 nm, and a nanostructure width in a range of approximately 110 nm to approximately 130 nm; and a grating structure in the blue color filter block has a grating pitch in a range of approximately 200 nm to approximately 220 nm, and a nanostructure width in a range of approximately 95 nm to approximately 115 nm.

Optionally, the grating structure in the red color filter block has a grating pitch of approximately 350 nm, and a nanostructure width of approximately 175 nm; the grating structure in the green color filter block has a grating pitch of approximately 240 nm, and a nanostructure width of approximately 120 nm; and the grating structure in the blue color filter block has a grating pitch of approximately 210 nm, and a nanostructure width of approximately 105 nm.

Optionally, the array substrate further comprises a plurality of thin film transistors, each of the plurality of thin film transistors comprising an active layer; wherein the plasmonic color filter layer and the active layer are in a same layer and are made of a same material.

Optionally, the plasmonic color filter layer and the active layer are made of polycrystalline silicon.

Optionally, the plasmonic color filter layer is doped with an n-type dopant.

Optionally, the plasmonic color filter layer is doped with a p-type dopant.

In another aspect, the present invention provides a method of fabricating an array substrate having a subpixel region and an inter-subpixel region, comprising forming a plasmonic color filter layer on a base substrate; the plasmonic color filter layer is formed to comprise a plurality of color filter blocks in the subpixel region; wherein each of the plurality of color filter blocks is formed to comprise a plurality of plasmonic nanostructures; and a first color filter block corresponding to a subpixel of a first color has an arrangement of nanostructures different from that of a second color filter block corresponding to a subpixel of a second color; the second color being different from the first color.

Optionally, the plurality of plasmonic nanostructures in each of the plurality of color filter blocks are formed to have a periodic arrangement of repeating plasmonic nanostructures.

Optionally, the method further comprises forming a plurality of thin film transistors, each of the plurality of thin film transistors comprising an active layer; wherein the plasmonic color filter layer and the active layer are formed in a single process.

Optionally, the method comprises forming a buffer layer on the base substrate; forming an amorphous silicon layer on a side of the buffer layer distal to the base substrate; crystallizing the amorphous silicon layer to form a polycrystalline silicon layer; and patterning the polycrystalline silicon layer to form the plasmonic color filter layer and the active layer.

Optionally, the method further comprises doping the plasmonic color filter layer with an n-type dopant.

Optionally, the method further comprises doping the plasmonic color filter layer with a p-type dopant.

In another aspect, the present invention provides a display panel comprising an array substrate described herein or fabricated by a method described herein.

In another aspect, the present invention provides a display apparatus comprising a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
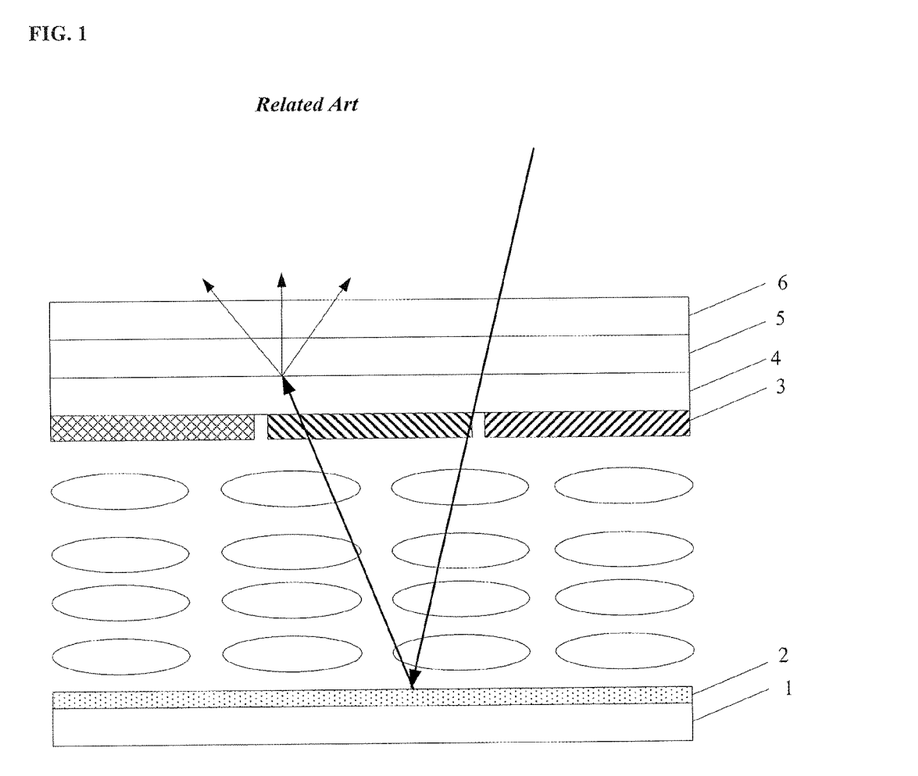
FIG. 1 is a diagram illustrating the structure of a conventional reflective liquid crystal display panel.

FIG. 1 is a diagram illustrating the structure of a conventional reflective liquid crystal display panel. Referring to FIG. 1, the conventional display panel includes a first base substrate 1 and a second base substrate 4 facing the first base substrate 1, a liquid crystal layer LC between the first base substrate 1 and the second base substrate 4, a polarizer 5 on a side of the second base substrate 4 distal to the first base substrate 1, a directional frontal scattering film 6 on a side of the polarizer 5 distal to the second base substrate 4, and a color filter layer 3 on a side of the second base substrate 4 distal to the polarizer 5. The color filter layer 3 are typically made of a material having an organic dye. The color filter layer 3 is typically fabricated using a complicated process, including forming a black matrix layer on the second base substrate 4, and separately forming a red color filter block, a green color filter block, and a blue color filter block. This leads to a relatively high manufacturing cost.

Accordingly, the present invention provides, inter alia, an array substrate, a display panel and a display apparatus having the same, and a fabricating method thereof that substantially obviate one or more of the problems due to limitations and disadvantages of the related art. In one aspect, the present disclosure provides an array substrate having a subpixel region and an inter-subpixel region. In some embodiments, the array substrate includes a plasmonic color filter layer including a plurality of color filter blocks in the subpixel region. In some embodiments, each of the plurality of color filter blocks includes a plurality of plasmonic nanostructures made of a semiconductor material.

As used herein, a subpixel region refers to a light emission region of a subpixel, such as a region corresponding to a pixel electrode in a liquid crystal display, or a region corresponding to a light emissive layer in an organic light emitting display. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Various suitable semiconductor material may be used for making the present plasmonic color filter layer. Examples of appropriate semiconductor materials for making the plasmonic color filter layer includes, but are not limited to, polycrystalline silicon, metal oxides (e.g., ITO, IZTO, IGTO), amorphous silicon, etc. In some embodiments, the semiconductor material for making the present plasmonic color filter layer is polycrystalline silicon. Optionally, the semiconductor material is doped with a dopant. Optionally, the semiconductor material is doped with an n-type dopant. semiconductor material is doped with a p-type dopant.

As used herein, the term "nanostructure" refers to a structure that has at least one region or characteristic dimension with a dimension of less than approximately 500 nm, including on the order of less than approximately 250 nm (e.g., less than approximately 200 nm). As used herein when referring to any numerical value, the term "approximately" refers to a value of ±10% of the stated value. Optionally, nanostructures are less than approximately 500 nm, less than approximately 400 nm, less than approximately 300 nm, less than approximately 250 nm, less than approximately 200 nm, less than approximately 150 nm in at least one characteristic dimension (e.g., the dimension across the width or length of the nanostructure). Nanostructure may have various suitable shapes such as a cylindrical shape (including a right cylindrical shape and an elliptical cylindrical shape), a cubical shape, a rod shape, a cone shape, a triangular prism shape, a pyramid shape, a rectangular prism shape, a hexagonal prism shape, etc. Similarly, a cross-section along a direction substantially parallel to the base substrate of a nanostructure may have various suitable shapes such as a circular shape, an elliptical shape, a square, a regular polygon, a triangle, a rectangular shape, a hexagon shape, etc.

In some embodiments, the plurality of plasmonic nanostructures in each of the plurality of color filter blocks have a non-periodic arrangement of repeating plasmonic nanostructures. In some embodiments, the plurality of plasmonic nanostructures in each of the plurality of color filter blocks have a pseudo-periodic arrangement of repeating plasmonic nanostructures. In some embodiments, the plurality of plasmonic nanostructures in each of the plurality of color filter blocks have a periodic arrangement of repeating plasmonic nanostructures.

In some embodiments, the plurality of plasmonic nanostructures in each of the plurality of color filter blocks have a periodicity and a nanostructure size. Optionally, the plurality of plasmonic nanostructures in each of the plurality of color filter blocks have varying periodicity and nanostructure size. Optionally, the plurality of plasmonic nanostructures in each of the plurality of color filter blocks have a single periodicity and a substantially uniform nanostructure size.

The plurality of plasmonic nanostructures in each of the plurality of color filter blocks may have various suitable arrangements. In some embodiments, the plurality of plasmonic nanostructures in each of the plurality of color filter blocks are arranged as an array of plasmonic nanostructures. In some embodiments, the plurality of plasmonic nanostructures in each of the plurality of color filter blocks are arranged as a grating structure, which includes a plurality of rows of plasmonic nanostructures or a plurality of columns of plasmonic nanostructures. When the plurality of plasmonic nanostructures in each of the plurality of color filter blocks are arranged as a grating structure, each row or each column has a width and a length, the width of each row or each column has a nanostructure dimension, the length may have a dimension larger than nanoscale. For example, the length of each row or each column of the grating structure may be larger than 1 micron.

Accordingly, the plasmonic nanostructures have a nanostructure size. For example, a cylindrical shaped nanostructure has a nanostructure diameter as the nanostructure size. A cubical shaped nanostructure has a nanostructure width as the nanostructure size. When the plurality of plasmonic nanostructures are arranged as a grating structure, the nanostructure size refers to a width of each row of the plasmonic nanostructure. Optionally, the plasmonic nanostructures have a uniform nanostructure size. Optionally, the plasmonic nanostructures have varying nanostructure size.

In some embodiments, the array substrate includes a plurality of pixels, each of which includes a plurality of subpixels of different colors. The plasmonic color filter layer includes a plurality of color filter blocks corresponding to the plurality of subpixels. Two color filter blocks corresponding to two subpixels of different colors have different arrangements of nanostructures. For example, in some embodiments, the plasmonic color filter layer includes a first color filter block corresponding to a subpixel of a first color has an arrangement of nanostructures different from that of a second color filter block corresponding to a subpixel of a second color; the second color being different from the first color (e.g., the first color and the second color are two different colors selected from red, green, and blue).

In some embodiments, the first color filter block has a first nanostructure arrangement, the second color filter block has a second nanostructure arrangement, the first nanostructure arrangement being different from the second nanostructure arrangement. Optionally, the first nanostructure arrangement is different from the second nanostructure arrangement in that the first nanostructure arrangement has a first periodicity different from a second periodicity of the second nanostructure arrangement. Optionally, the first nanostructure arrangement is different from the second nanostructure arrangement in that the first nanostructure arrangement has a first nanostructure size different from a second nanostructure size of the second nanostructure arrangement. Optionally, the first nanostructure arrangement is different from the second nanostructure arrangement in that the nanostructures in the first color filter block have a first shape different from a second shape of the nanostructures in the second color filter block.

In some embodiments, the array substrate includes a plurality of pixels, each of which includes a red subpixel, a green subpixel, and a blue subpixel. The array substrate also includes a plasmonic color filter layer having a plurality of red color filter block corresponding to a plurality of red subpixels, a plurality of green color filter block corresponding to a plurality of green subpixels, and a plurality of blue color filter block corresponding to a plurality of blue subpixels. The red color filter block has a first nanostructure arrangement, the green color filter block has a second nanostructure arrangement, and the blue color filter block has a third nanostructure arrangement. The first nanostructure arrangement, the second nanostructure arrangement, and the third nanostructure arrangement are different from each other. Optionally, the first nanostructure arrangement, the second nanostructure arrangement, and the third nanostructure arrangement have different periodicity. Optionally, the first nanostructure arrangement, the second nanostructure arrangement, and the third nanostructure arrangement have nanostructure sizes. Optionally, the first nanostructure arrangement, the second nanostructure arrangement, and the third nanostructure arrangement have different nanostructure shapes.

Figure 2:
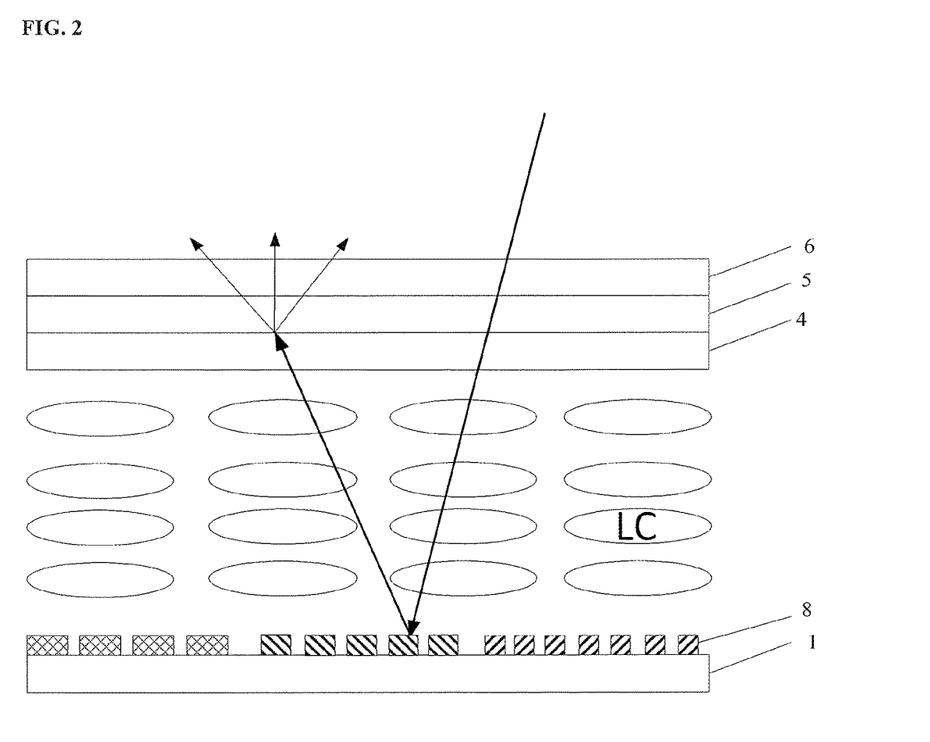
FIG. 2 is a diagram illustrating the structure a reflective liquid crystal display panel in some embodiments according to the present disclosure.

FIG. 2 is a diagram illustrating the structure a reflective liquid crystal display panel in some embodiments according to the present disclosure. Referring to FIG. 2, the array substrate includes a plasmonic color filter layer having a plurality of color filter blocks 8 in a subpixel region 7 on a base substrate. The plasmonic color filter layer in FIG. 2 includes three color filter blocks 8-1, 8-2, and 8-3. Each of the color filter blocks includes a plurality of plasmonic nanostructures 8. The plurality of plasmonic nanostructures 8 in each of the plurality of color filter blocks 8-1, 8-2, and 8-3 has a periodic arrangement of plasmonic nanostructures 8.

Figure 3:
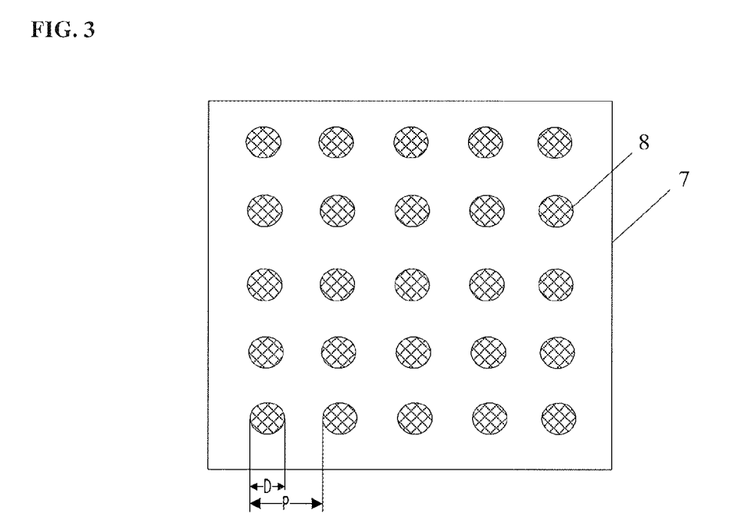
FIG. 3 is a diagram illustrating a color filter block having an array of a plurality of plasmonic nanostructures in some embodiments according to the present disclosure.
Figure 4:
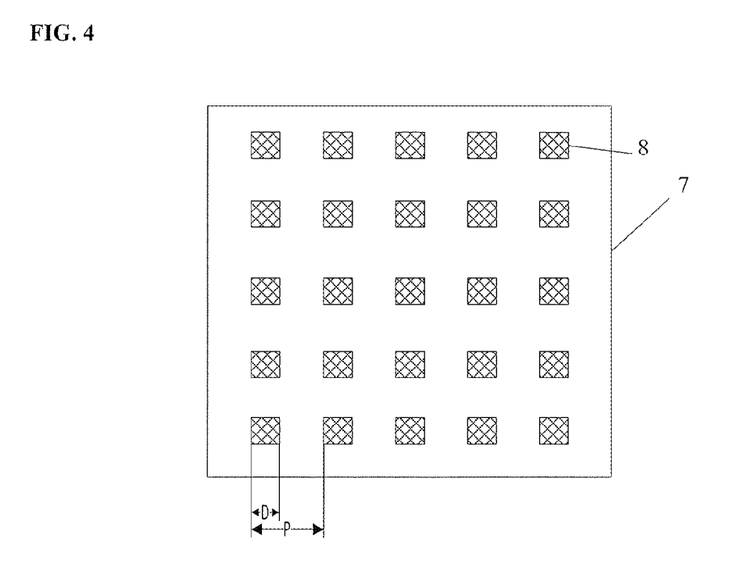
FIG. 4 is a diagram illustrating a color filter block having an array of a plurality of plasmonic nanostructures in some embodiments according to the present disclosure.

FIG. 3 is a diagram illustrating a color filter block having an array of a plurality of plasmonic nanostructures in some embodiments according to the present disclosure. Referring to FIG. 3, the color filter block in the embodiments includes an array of plasmonic nanostructures 8 in the subpixel region 7. The array of plasmonic nanostructures 8 has an array pitch P and nanostructure size, which is a nanostructure diameter D. FIG. 4 is a diagram illustrating a color filter block having an array of a plurality of plasmonic nanostructures in some embodiments according to the present disclosure. Referring to FIG. 4, the color filter block in the embodiments includes an array of plasmonic nanostructures 8 in the subpixel region 7. The array of nanostructures 8 has an array pitch P and nanostructure size, which is a nanostructure width D. Optionally, a cross-section along a direction substantially parallel to the base substrate of each of the plurality of plasmonic nanostructures has a circular shape; and the nanostructure size is a nanostructure diameter of the circular shape (as shown in FIG. 3). Optionally, a cross-section along a direction substantially parallel to the base substrate of each of the plurality of plasmonic nanostructures has a square shape; and the nanostructure size is a nanostructure width of the square shape (as shown in FIG. 4).

In some embodiments, color filter blocks corresponding to subpixels of different colors have different array pitches P, different nanostructure sizes D or different array pitches P and different nanostructure sizes D. For example, the array substrate may include a subpixel of a first color, a subpixel of a second color, a first color filter block corresponding to the subpixel of the first color, and a second color filter block corresponding to the subpixel of the second color. Light configured to transmitted through the first color filter block has a first wavelength, and light configured to transmitted through the second color filter block has a second wavelength, the first wavelength being larger than the second wavelength. The first color filter block includes a first array of plasmonic nanostructures having a first array pitch and a first nanostructure size. The second color filter block includes a second array of plasmonic nanostructures having a second array pitch and a second nanostructure size. Optionally, the first array pitch is larger than the second array pitch. Optionally, the first nanostructure size is larger than the second nanostructure size. Optionally, the first array pitch is larger than the second array pitch, and the first nanostructure size is larger than the second nanostructure size.

In some embodiments, color filter blocks corresponding to red subpixels, green subpixels, and blue subpixels, respectively, have different array pitches P, different nanostructure sizes D, or different array pitches P and different nanostructure sizes D. Optionally, the array substrate includes a red color filter block corresponding to a red subpixel, and a green color filter block corresponding to a green subpixel, and a blue color filter block corresponding to a blue subpixel. The red color filter block includes a first array of plasmonic nanostructures having a first array pitch and a first nanostructure size. The green color filter block includes a second array of plasmonic nanostructures having a second array pitch and a second nanostructure size. The blue color filter block includes a third array of plasmonic nanostructures having a third array pitch and a third nanostructure size. Optionally, the first array pitch is larger than the second array pitch, and the second array pitch is larger than the third array pitch. Optionally, the first nanostructure size is larger than the second nanostructure size, and the second nanostructure size is larger than the third nanostructure size. Optionally, the first array pitch is larger than the second array pitch, the second array pitch is larger than the third array pitch, the first nanostructure size is larger than the second nanostructure size, and the second nanostructure size is larger than the third nanostructure size.

Thus, by varying nanostructure pattern or nanostructure arrangement, the color filter block may be configured so that light transmitted through the color filter has different colors, e.g., different wavelengths. By having the present plasmonic color filter, the array substrate may be fabricated by a much simplified process, obviating the need of multiple fabricating procedures of a conventional color filter. A higher light filtering efficiency and a lower manufacturing cost can be achieved by using the present plasmonic color filter.

Figure 6:
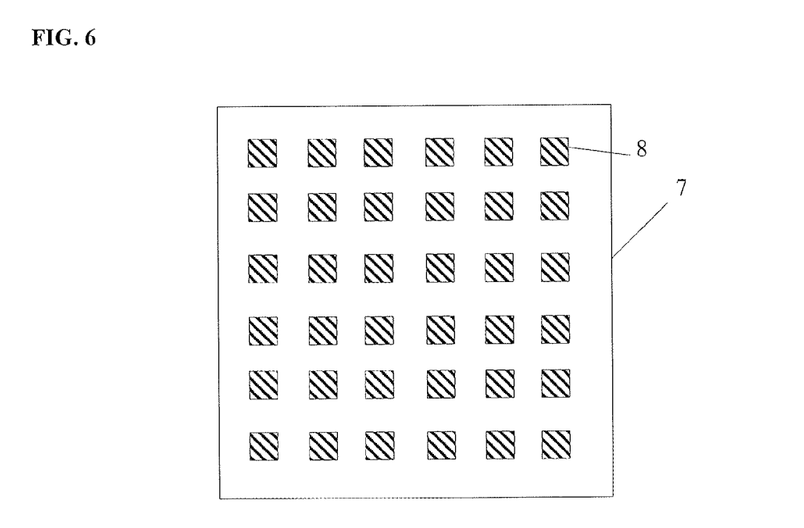
FIG. 6 is a diagram illustrating a color filter block having an array of a plurality of plasmonic nanostructures in a first subpixel of an array substrate in some embodiments according to the present disclosure.
Figure 7:
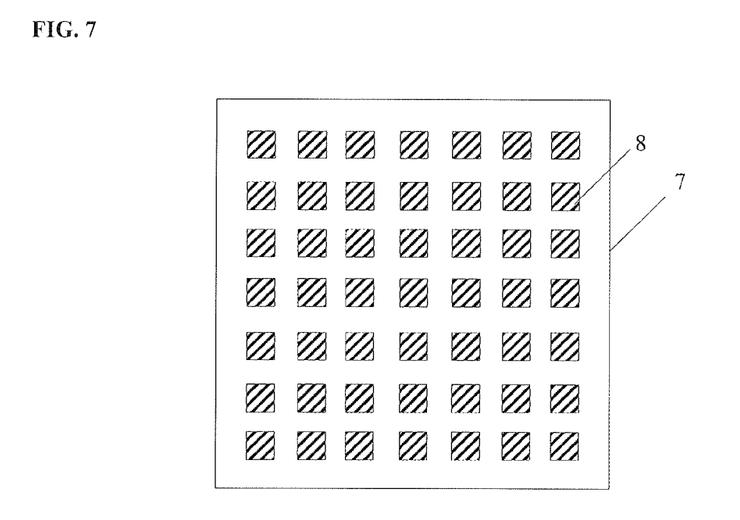
FIG. 7 is a diagram illustrating a color filter block having an array of a plurality of plasmonic nanostructures in a second subpixel of an array substrate in some embodiments according to the present disclosure.
Figure 8:
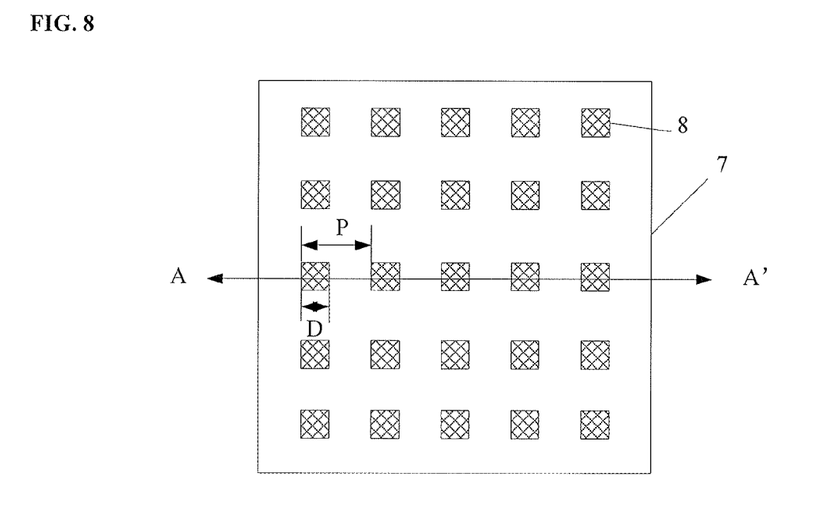
FIG. 8 is a diagram illustrating a color filter block having an array of a plurality of plasmonic nanostructures in a third subpixel of an array substrate in some embodiments according to the present disclosure.
Figure 9:
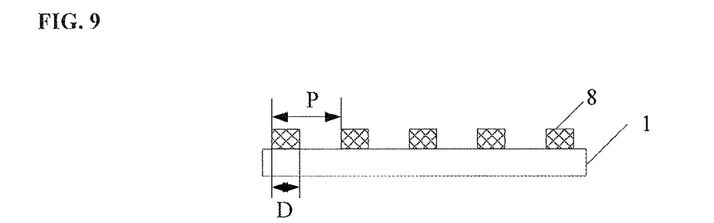
FIG. 9 shows a cross-sectional view along the A-A' direction of the color filter block in FIG. 8.

In some embodiments, the plasmonic color filter layer includes a red color filter block corresponding to a red subpixel, a green color filter block corresponding to the green subpixel, and a blue color filter block corresponding to the blue subpixel. Optionally, an array of plasmonic nanostructures in the red color filter block has an array pitch in a range of approximately 340 nm to approximately 360 nm, and a nanostructure size in a range of approximately 165 nm to approximately 185 nm (see FIG. 8 and FIG. 9). Optionally, an array of plasmonic nanostructures in the green color filter block has an array pitch in a range of approximately 230 nm to approximately 250 nm, and a nanostructure size in a range of approximately 110 nm to approximately 130 nm (see FIG. 6). Optionally, an array of plasmonic nanostructures in the blue color filter block has an array pitch in a range of approximately 200 nm to approximately 220 nm, and a nanostructure size in a range of approximately 95 nm to approximately 115 nm (see FIG. 7). Optionally, the array of plasmonic nanostructures in the red color filter block has an array pitch in a range of approximately 340 nm to approximately 360 nm, and a nanostructure size in a range of approximately 165 nm to approximately 185 nm; the array of plasmonic nanostructures in the green color filter block has an array pitch in a range of approximately 230 nm to approximately 250 nm, and a nanostructure size in a range of approximately 110 nm to approximately 130 nm; and the array of plasmonic nanostructures in the blue color filter block has an array pitch in a range of approximately 200 nm to approximately 220 nm, and a nanostructure size in a range of approximately 95 nm to approximately 115 nm. Optionally, a cross-section along a direction substantially parallel to the base substrate of each of the plurality of plasmonic nanostructures has a circular shape; and the nanostructure size is a nanostructure diameter of the circular shape (see, e.g., FIG. 3). Optionally, a cross-section along a direction substantially parallel to the base substrate of each of the plurality of plasmonic nanostructures has a square shape; and the nanostructure size is a nanostructure width of the square shape (see, e.g., FIG. 4).

Optionally, the array of plasmonic nanostructures in the red color filter block has an array pitch of approximately 350 nm, and a nanostructure size of approximately 175 nm. Optionally, the array of plasmonic nanostructures in the green color filter block has an array pitch of approximately 240 nm, and a nanostructure size of approximately 120 nm. Optionally, the array of plasmonic nanostructures in the blue color filter block has an array pitch of approximately 210 nm, and a nanostructure size of approximately 105 nm. Optionally, the array of plasmonic nanostructures in the red color filter block has an array pitch of approximately 350 nm, and a nanostructure size of approximately 175 nm; the array of plasmonic nanostructures in the green color filter block has an array pitch of approximately 240 nm, and a nanostructure size of approximately 120 nm; and the array of plasmonic nanostructures in the blue color filter block has an array pitch of approximately 210 nm, and a nanostructure size of approximately 105 nm.

Figure 5:
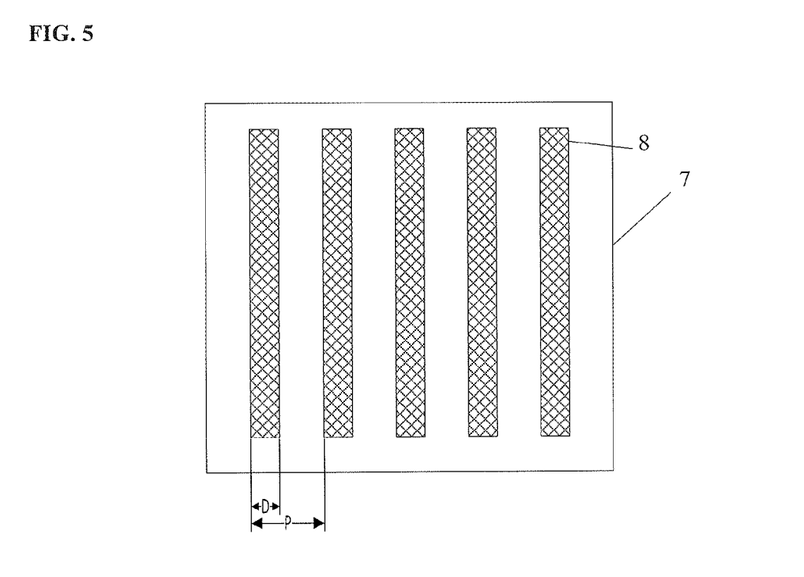
FIG. 5 is a diagram illustrating a color filter block having a grating structure including a plurality of rows of rectangular plasmonic nanostructures in some embodiments according to the present disclosure.

FIG. 5 is a diagram illustrating a color filter block having a grating structure including a plurality of rows of rectangular plasmonic nanostructures in some embodiments according to the present disclosure. Referring to FIG. 5, the color filter block in the embodiment has a grating structure including a plurality of rows of rectangular plasmonic nanostructures 8 in a subpixel region 7 of the array substrate. The grating structure of plasmonic nanostructures 8 has a grating pitch P and nanostructure size, which is a nanostructure width D. Optionally, a cross-section along a direction substantially parallel to the base substrate of each of the plurality of plasmonic nanostructures 8 has a rectangular shape; and the nanostructure size is a nanostructure width of the rectangular shape.

In some embodiments, color filter blocks corresponding to subpixels of different colors have different grating pitches P, different nanostructure width D, or different grating pitches P and different nanostructure width D. For example, the array substrate may include a subpixel of a first color, a subpixel of a second color, a first color filter block corresponding to the subpixel of the first color, and a second color filter block corresponding to the subpixel of the second color. Light configured to transmitted through the first color filter block has a first wavelength, and light configured to transmitted through the second color filter block has a second wavelength, the first wavelength being larger than the second wavelength. The first color filter block includes a first grating structure of plasmonic nanostructures having a first grating pitch and a first nanostructure width. The second color filter block includes a second grating structure of plasmonic nanostructures having a second grating pitch and a second nanostructure width. Optionally, the first grating pitch is larger than the second grating pitch. Optionally, the first nanostructure width is larger than the second nanostructure width. Optionally, the first grating pitch is larger than the second grating pitch, and the first nanostructure width is larger than the second nanostructure width.

In some embodiments, color filter blocks corresponding to red subpixels, green subpixels, and blue subpixels, respectively, have different grating pitches P, different nanostructure widths D, or different grating pitches P and different nanostructure widths D. Optionally, the array substrate includes a red color filter block corresponding to a red subpixel, and a green color filter block corresponding to a green subpixel, and a blue color filter block corresponding to a blue subpixel. The red color filter block includes a first grating structure of plasmonic nanostructures having a first grating pitch and a first nanostructure width. The green color filter block includes a second grating structure of plasmonic nanostructures having a second grating pitch and a second nanostructure width. The blue color filter block includes a third grating structure of plasmonic nanostructures having a third grating pitch and a third nanostructure width. Optionally, the first grating pitch is larger than the second array pitch, and the second grating pitch is larger than the third array pitch. Optionally, the first nanostructure width is larger than the second nanostructure width, and the second nanostructure width is larger than the third nanostructure width. Optionally, the first grating pitch is larger than the second grating pitch, the second grating pitch is larger than the third grating pitch, the first nanostructure width is larger than the second nanostructure width, and the second nanostructure width is larger than the third nanostructure width.

Thus, by varying nanostructure pattern or nanostructure arrangement, the color filter block may be configured so that light transmitted through the color filter has different colors, e.g., different wavelengths. By having the present plasmonic color filter, the array substrate may be fabricated by a much simplified process, obviating the need of multiple fabricating procedures of a conventional color filter. A higher light filtering efficiency and a lower manufacturing cost can be achieved by using the present plasmonic color filter.

In some embodiments, the plasmonic color filter layer includes a red color filter block corresponding to a red subpixel, a green color filter block corresponding to the green subpixel, and a blue color filter block corresponding to the blue subpixel. Optionally, a grating structure of plasmonic nanostructures in the red color filter block has a grating pitch in a range of approximately 340 nm to approximately 360 nm, and a nanostructure width in a range of approximately 165 nm to approximately 185 nm. Optionally, a grating structure of plasmonic nanostructures in the green color filter block has a grating pitch in a range of approximately 230 nm to approximately 250 nm, and a nanostructure width in a range of approximately 110 nm to approximately 130 nm. Optionally, a grating structure of plasmonic nanostructures in the blue color filter block has a grating pitch in a range of approximately 200 nm to approximately 220 nm, and a nanostructure width in a range of approximately 95 nm to approximately 115 nm. Optionally, the grating structure of plasmonic nanostructures in the red color filter block has a grating pitch in a range of approximately 340 nm to approximately 360 nm, and a nanostructure width in a range of approximately 165 nm to approximately 185 nm; the grating structure of plasmonic nanostructures in the green color filter block has a grating pitch in a range of approximately 230 nm to approximately 250 nm, and a nanostructure width in a range of approximately 110 nm to approximately 130 nm; and the grating structure of plasmonic nanostructures in the blue color filter block has a grating pitch in a range of approximately 200 nm to approximately 220 nm, and a nanostructure width in a range of approximately 95 nm to approximately 115 nm.

Optionally, the grating structure of plasmonic nanostructures in the red color filter block has a grating pitch of approximately 350 nm, and a nanostructure width of approximately 175 nm. Optionally, the grating structure of plasmonic nanostructures in the green color filter block has a grating pitch of approximately 240 nm, and a nanostructure width of approximately 120 nm. Optionally, the grating structure of plasmonic nanostructures in the blue color filter block has a grating pitch of approximately 210 nm, and a nanostructure width of approximately 105 nm. Optionally, the grating structure of plasmonic nanostructures in the red color filter block has a grating pitch of approximately 350 nm, and a nanostructure width of approximately 175 nm; the grating structure of plasmonic nanostructures in the green color filter block has an grating pitch of approximately 240 nm, and a nanostructure width of approximately 120 nm; and the grating structure of plasmonic nanostructures in the blue color filter block has a grating pitch of approximately 210 nm, and a nanostructure width of approximately 105 nm.

In some embodiments, the array substrate further includes a plurality of thin film transistors, each of the plurality of thin film transistors including an active layer. Optionally, the plasmonic color filter layer and the active layer are in a same layer and are made of a same semiconductor material. Optionally, the plasmonic color filter layer and the active layer are made of polycrystalline silicon. Optionally, the plasmonic color filter layer is doped with an n-type dopant. Optionally, the plasmonic color filter layer is doped with a p-type dopant. By having a dopant in the plasmonic color filter layer, light filter efficiency can be greatly enhanced.

Figure 10:
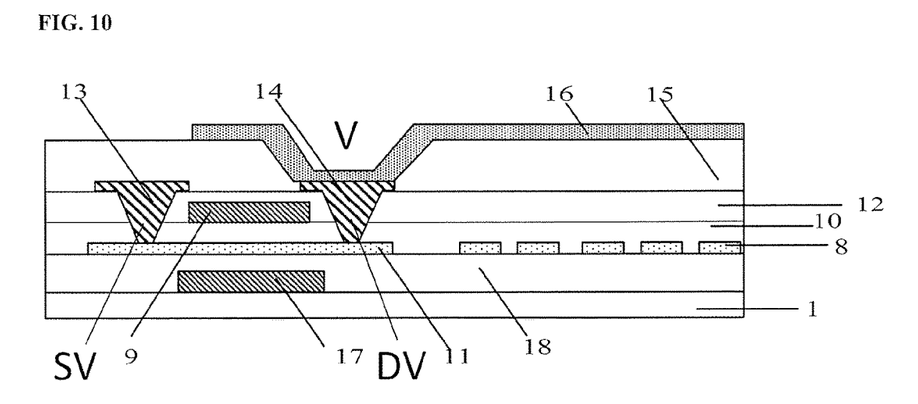
FIG. 10 is a diagram illustrating the structure of an array substrate in some embodiments according to the present disclosure.

FIG. 10 is a diagram illustrating the structure of an array substrate in some embodiments according to the present disclosure. Referring to FIG. 10, the array substrate in the embodiment include a base substrate 1; a light shielding layer 17 on the base substrate 1; a buffer layer 18 on a side of the light shield layer 17 distal to the base substrate 1; an active layer 11 and a plasmonic color filter layer 8 on a side of the buffer layer 18 distal to the base substrate 1; the active layer 11 and the plasmonic color filter layer 8 being in a same layer; a gate insulating layer 10 on a side of the active layer 11 and the plasmonic color filter layer 8 distal to the buffer layer 18; a gate electrode layer 9 on a side of the gate insulating layer 10 distal to the active layer 11; an interlayer dielectric layer 12 on a side of the gate electrode layer 9 distal to the gate insulating layer 10; a source electrode 13 and a drain electrode 14 on a side of the interlayer dielectric layer 12 distal to the active layer 11; a source via SV and a drain via DV extending through the interlayer dielectric layer 12 and the gate insulating layer 10; the source electrode 13 and the drain electrode 14 electrically connected to the active layer 11 through the source via SV and the drain via DV, respectively; a passivation layer 15 on a side of the source electrode 13 and the drain electrode 14 distal to the interlayer dielectric layer 12; a pixel electrode 16 on a side of the passivation layer 15 distal to the interlayer dielectric layer 12; and a via V extending through the passivation layer 15; the pixel electrode 16 being electrically connected to the drain electrode 14 through the via V.

Various appropriate materials and various appropriate fabricating methods may be used for making the base substrate. Examples of materials suitable for making the base substrate include, but are not limited to, glass, quartz, polyimide, and polyester, etc.

Various appropriate materials and various appropriate fabricating methods may be used for making the light shield layer. Optionally, the light shielding layer is made of a metal material.

Various appropriate materials and various appropriate fabricating methods may be used for making the pixel electrode. Examples of materials suitable for making the pixel electrode include, but are not limited to, a metal oxide such as indium tin oxide, indium zinc oxide, and aluminum zinc oxide.

In another aspect, the present disclosure provides a method of fabricating an array substrate having a subpixel region and an inter-subpixel region. In some embodiments, the method includes forming a plasmonic color filter layer on a base substrate; the plasmonic color filter layer is formed to include a plurality of color filter blocks in the subpixel region, each of the plurality of color filter blocks is formed to includes a plurality of plasmonic nanostructures. Optionally, the plurality of plasmonic nanostructures in each of the plurality of color filter blocks are formed to have a periodic arrangement of repeating plasmonic nanostructures.

By forming the plurality of plasmonic nanostructures having different nanostructure patterns or nanostructure arrangements, color filter blocks may be configured so that light transmitted through different color filter blocks may have different colors, e.g., different wavelengths. By forming a plasmonic color filter using the present method, the array substrate may be fabricated by a much simplified process, obviating the need of multiple fabricating procedures of a conventional color filter. A higher light filtering efficiency and a lower manufacturing cost can be achieved by using a plasmonic color filter fabricated by the present method.

In some embodiments, the plurality of plasmonic nanostructures are formed using polycrystalline silicon. Optionally, the plurality of plasmonic nanostructures are formed using polycrystalline silicon doped with a dopant.

In some embodiments, the method further includes forming a plurality of thin film transistors, each of the plurality of thin film transistors including an active layer. Optionally, the plasmonic color filter layer and the active layer are formed in a single process, e.g., using a same material and patterned in a single process.

In some embodiments, the method includes forming a buffer layer on the base substrate; forming an amorphous silicon layer on a side of the buffer layer distal to the base substrate; crystallizing the amorphous silicon layer to form a polycrystalline silicon layer; and patterning the polycrystalline silicon layer to form the plasmonic color filter layer and the active layer. The crystallization step may be performed utilizing any appropriate crystallization method. In some embodiments, the crystallization step is performed utilizing a method selected from the group consisting of excimer laser annealing (ELA), solid phase crystallization (SPC), sequential lateral solidification (SLS), metal induced crystallization (MIC), and metal-induced lateral crystallization (MILC).

In some embodiments, subsequent to the step of forming the plasmonic color filter layer, the method further includes doping the plasmonic color filter layer with a dopant. Optionally, the method includes doping the plasmonic color filter layer with an n-type dopant. Optionally, the method includes doping the plasmonic color filter layer with a p-type dopant. Examples of n-type dopants include, but are not limited to, a Group VA element of the Periodic Table of the Elements including nitrogen (N), phosphorous (P), arsenic (As), antimony (Sb), and bismuth (Bi). Examples of p-type dopants include, but are not limited to, a Group IIIA element of the Periodic Table of the Elements including boron (B), aluminum (Al), gallium (Ga), indium (In), and thallium (Tl). By having a dopant in the plasmonic color filter layer, light filter efficiency can be greatly enhanced.

In some embodiments, the step of doping the plasmonic color filter layer with an n-type dopant is performed using an n-type dopant concentration in a range of approximately $2 \times 10^{12}$ atom/cm$^3$ to approximately $5 \times 10^{14}$ atom/cm$^3$. In one example, the doping may be performed under the following conditions: a current density in a range of approximately 5 $\mu$A/cm to approximately 100 $\mu$A/cm; an electron energy in a range of approximately 15 Kev to approximately 30 Kev. Optionally, the doping is performed using a phosphine gas.

In some embodiments, the step of doping the plasmonic color filter layer with an n-type dopant is performed using a p-type dopant concentration in a range of approximately $2 \times 10^{12}$ atom/cm$^3$ to approximately $5 \times 10^{14}$ atom/cm$^3$. In one example, the doping may be performed under the following conditions: a current density in a range of approximately 5 $\mu$A/cm to approximately 100 $\mu$A/cm; an electron energy in a range of approximately 15 Kev to approximately 30 Kev. Optionally, the doping is performed using a boron trifluoride.

In some embodiments, the method includes forming a gate insulating layer on a side of the active layer and the plasmonic color filter layer distal to the buffer layer; forming a gate electrode layer on a side of the gate insulating layer distal to the active layer; forming an interlayer dielectric layer on a side of the gate electrode layer distal to the gate insulating layer; forming a source via and a drain via extending through the interlayer dielectric layer and the gate insulating layer; forming a source electrode and a drain electrode on a side of the interlayer dielectric layer distal to the active layer; the source electrode and the drain electrode electrically connected to the active layer through the source via and the drain via, respectively; forming a passivation layer on a side of the source electrode and the drain electrode distal to the interlayer dielectric layer; forming a via extending through the passivation layer; and forming a pixel electrode on a side of the passivation layer distal to the interlayer dielectric layer; the pixel electrode being electrically connected to the drain electrode through the via.

In another aspect, the present disclosure provides a display panel having an array substrate described herein or fabricated by a method described herein. Referring to FIG. 2, the display panel in some embodiments include a first base substrate 1 and a second base substrate 4 facing the first base substrate 1, a liquid crystal layer LC between the first base substrate 1 and the second base substrate 4, a polarizer 5 on a side of the second base substrate 4 distal to the first base substrate 1, a directional frontal scattering film 6 on a side of the polarizer 5 distal to the second base substrate 4, and a plasmonic color filter layer 8 on the first base substrate 1 (e.g., on a side of the first base substrate 1 proximal to the second base substrate 4. The plasmonic color filter layer includes a plurality of color filter blocks. Optionally, the plurality of plasmonic nanostructures in each of the plurality of color filter blocks have a periodic arrangement of repeating plasmonic nanostructures.

In one example, the color filter block includes a grating structure including a plurality of rows of rectangular plasmonic nanostructures (see, e.g., FIG. 5). The grating structure having a grating pitch P, each of the plurality of rows of rectangular plasmonic nanostructures having a nanostructure width D. Color filter blocks corresponding to subpixels of different colors have different grating pitches P, different nanostructure width D, or different grating pitches P and different nanostructure width D. When light (e.g., an ambient light or light from a light guide plate) enters the display panel, it is reflected by the plasmonic color filter layer. A color filter block having a nanostructure arrangement reflects light of a corresponding wavelength, and absorbs light of other wavelengths, thereby achieving the color filtering function.

In some embodiments, color filter blocks corresponding to red subpixels, green subpixels, and blue subpixels, respectively, have different grating pitches P, different nanostructure width D, or different grating pitches P and different nanostructure width D. When light irradiates on the plasmonic color filter layer, the color filter block corresponding to the red subpixels reflects light of a red color, the color filter block corresponding to the green subpixels reflects light of a green color, and the color filter block corresponding to the blue subpixels reflects light of a blue color.

In some embodiments, the display panel may further include yellow subpixels, magenta subpixels, and cyan subpixels. Color filter blocks corresponding to yellow subpixels, magenta subpixels, and cyan subpixels, respectively, have different grating pitches P, different nanostructure width D, or different grating pitches P and different nanostructure width D. When light irradiates on the plasmonic color filter layer, the color filter block corresponding to the yellow subpixels reflects light of a yellow color, the color filter block corresponding to the magenta subpixels reflects light of a magenta color, and the color filter block corresponding to the cyan subpixels reflects light of a cyan color.

In some embodiments, the array substrate of the display panel further includes a plurality of thin film transistors. Referring to FIG. 10, each of the plurality of thin film transistors may include a gate electrode layer 9, a gate insulating layer 10, an active layer 11, an interlayer dielectric layer 12, a source electrode 13, a drain electrode 14, a passivation layer 15, and a pixel electrode 16 on the passivation layer 15. Optionally, the plasmonic color filter layer 8 and the active layer 11 are in a same layer and are made of a same material.

In some embodiments, the method of fabricating an array substrate of FIG. 10 includes depositing a metal material layer on the base substrate 1; patterning the metal material layer to form a light shielding layer 17; forming a buffer layer 18 on the base substrate 1 having the light shielding layer 17; depositing an amorphous silicon layer on a side of the buffer layer 18 distal to the base substrate 1; crystallizing the amorphous silicon layer to form a polycrystalline silicon layer; patterning the polycrystalline silicon layer to form the plasmonic color filter layer 8 and the active layer 11; forming a gate insulating layer 10 on a side of the plasmonic color filter layer 8 and the active layer 11 distal to the buffer layer 18; depositing a metal material layer on a side of the gate insulating layer 10 distal to the active layer 11; patterning the metal material layer to form a gate electrode layer 9 and a gate line.

Optionally, the method further includes doping a source electrode contact region and a drain electrode contact region with a dopant using the gate electrode layer 9 as a mask. Optionally, the method further includes doping the plasmonic color filter layer 8 with a dopant. Optionally, the dopant is an n-type dopant. Optionally, the dopant is a p-type dopant.

Optionally, the method further includes forming an interlayer dielectric layer 12 on a side of the gate electrode layer 9 distal to the gate insulating layer 10; forming a source via SV and a drain via SV extending through the interlayer dielectric layer 12 and the gate insulating layer 10; depositing a metal material layer on a side of the interlayer dielectric layer 12 distal to the buffer layer 18; patterning the metal material layer to form a source electrode 13, a drain electrode 14, and a data line; the source electrode 13 and the drain electrode 14 electrically connected to the active layer 11 through the source via SV and the drain via DV, respectively; forming a passivation layer 15 on a side of the source electrode SV and the drain electrode DV distal to the interlayer dielectric layer 12; forming a via V extending through the passivation layer 15; depositing a transparent conductive electrode material layer on side of the passivation layer 15 distal to the interlayer dielectric layer 12; patterning the transparent conductive electrode material layer to form a pixel electrode 16, the pixel electrode 16 being electrically connected to the drain electrode 14 through the via V.

Thus, by varying nanostructure pattern or nanostructure arrangement, the color filter block may be configured so that light transmitted through the color filter has different colors, e.g., different wavelengths. By having the present plasmonic color filter, the display panel may be fabricated by a much simplified process, obviating the need of multiple fabricating procedures of a conventional color filter. A higher light filtering efficiency and a lower In another aspect, the present disclosure provides a display apparatus having a display panel described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate having a subpixel region and an inter-subpixel region, comprising:
   a plasmonic color filter layer comprising a plurality of color filter blocks in the subpixel region on a base substrate; and
   a plurality of thin film transistors, a respective one of the plurality of thin film transistors comprising an active layer;
   wherein a respective one of the plurality of color filter blocks comprises a plurality of plasmonic nanostructures made of a semiconductor material;
   a first color filter block corresponding to a subpixel of a first color has a first arrangement of nanostructures;
   a second color filter block corresponding to a subpixel of a second color has a second arrangement of nanostructures;
   the first arrangement of nanostructures is different from the second arrangement of nanostructures;
   the second color is different from the first color; and
   the plasmonic color filter layer and the active layer are in a same layer and are made of a same material.

2. The array substrate of claim 1, wherein the plurality of plasmonic nanostructures in the respective one of the plurality of color filter blocks have a periodic arrangement of repeating plasmonic nanostructures.

3. The array substrate of claim 1, wherein the plurality of plasmonic nanostructures are made of polycrystalline silicon.

4. The array substrate of claim 3, wherein the plurality of plasmonic nanostructures are made of polycrystalline silicon doped with a dopant.

5. The array substrate of claim 1, wherein at least one of the plurality of color filter blocks comprises an array of plasmonic nanostructures having an array pitch and nanostructure size;
   light configured to transmitted through the first color filter block has a first wavelength; light configured to transmitted through the second color filter block has a second wavelength; the first wavelength being larger than the second wavelength;
   an array of plasmonic nanostructures in the first color filter block has a first array pitch and a first nanostructure size; an array of plasmonic nanostructures in the second color filter block has a second array pitch and a second nanostructure size;

the first array pitch is larger than the second array pitch; and the first nanostructure size is larger than the second nanostructure size.

6. The array substrate of claim 5, wherein a cross-section along a direction substantially parallel to the base substrate of a respective one of the plurality of plasmonic nanostructures has a shape selected from the group consisting of a circular shape, an elliptical shape, a square, and a regular polygon.

7. The array substrate of claim 6, wherein the plasmonic color filter layer comprises a red color filter block corresponding to a red subpixel, a green color filter block corresponding to a green subpixel, and a blue color filter block corresponding to a blue subpixel;

an array of plasmonic nanostructures in the red color filter block has an array pitch in a range of approximately 340 nm to approximately 360 nm, and a nanostructure size in a range of approximately 165 nm to approximately 185 nm;

an array of plasmonic nanostructures in the green color filter block has an array pitch in a range of approximately 230 nm to approximately 250 nm, and a nanostructure size in a range of approximately 110 nm to approximately 130 nm; and an array of plasmonic nanostructures in the blue color filter block has an array pitch in a range of approximately 200 nm to approximately 220 nm, and a nanostructure size in a range of approximately 95 nm to approximately 115 nm.

8. The array substrate of claim 7, wherein the array of plasmonic nanostructures in the red color filter block has an array pitch of approximately 350 nm, and a nanostructure size of approximately 175 nm;

the array of plasmonic nanostructures in the green color filter block has an array pitch of approximately 240 nm, and a nanostructure size of approximately 120 nm; and the array of plasmonic nanostructures in the blue color filter block has an array pitch of approximately 210 nm, and a nanostructure size of approximately 105 nm.

9. The array substrate of claim 7, wherein a cross-section along a direction substantially parallel to the base substrate of the respective one of the plurality of plasmonic nanostructures has a circular shape; and the nanostructure size is a nanostructure diameter of the circular shape.

10. The array substrate of claim 7, wherein a cross-section along a direction substantially parallel to the base substrate of the respective one of the plurality of plasmonic nanostructures has a square shape; and the nanostructure size is a nanostructure width of the square shape.

11. The array substrate of claim 1, wherein at least one of the plurality of color filter blocks has a grating structure comprising a plurality of rows of rectangular plasmonic nanostructures; the grating structure having a grating pitch, a respective row of the plurality of rows of rectangular plasmonic nanostructures having a nanostructure width;

light configured to transmitted through the first color filter block has a first wavelength; light configured to transmitted through the second color filter block has a second wavelength; the first wavelength being larger than the second wavelength;

a grating structure in the first color filter block has a first grating pitch and a first nanostructure width; a grating structure in the second color filter block has a second grating pitch and a second nanostructure width;

the first grating pitch is larger than the second grating pitch; and the first nanostructure width is larger than the second nanostructure width.

12. The array substrate of claim 11, wherein the plasmonic color filter layer comprises a red color filter block corresponding to a red subpixel, a green color filter block corresponding to a green subpixel, and a blue color filter block corresponding to a blue subpixel;

a grating structure in the red color filter block has a grating pitch in a range of approximately 340 nm to approximately 360 nm, and a nanostructure width in a range of approximately 165 nm to approximately 185 nm;

a grating structure in the green color filter block has a grating pitch in a range of approximately 230 nm to approximately 250 nm, and a nanostructure width in a range of approximately 110 nm to approximately 130 nm; and a grating structure in the blue color filter block has a grating pitch in a range of approximately 200 nm to approximately 220 nm, and a nanostructure width in a range of approximately 95 nm to approximately 115 nm.

13. The array substrate of claim 12, wherein the grating structure in the red color filter block has a grating pitch of approximately 350 nm, and a nanostructure width of approximately 175 nm;

the grating structure in the green color filter block has a grating pitch of approximately 240 nm, and a nanostructure width of approximately 120 nm; and the grating structure in the blue color filter block has a grating pitch of approximately 210 nm, and a nanostructure width of approximately 105 nm.

14. The array substrate of claim 1, wherein the plasmonic color filter layer and the active layer are made of polycrystalline silicon.

15. A display panel, comprising an array substrate of claim 1.

16. The array substrate of claim 1, wherein the plasmonic color filter layer is doped with an n-type dopant.

17. The array substrate of claim 1, wherein the plasmonic color filter layer is doped with an n-type dopant.

18. A method of fabricating an array substrate having a subpixel region and an inter-subpixel region, comprising:

forming a plasmonic color filter layer on a base substrate; the plasmonic color filter layer is formed to comprise a plurality of color filter blocks in the subpixel region; and forming a plurality of thin film transistors, a respective one of the plurality of thin film transistors formed to comprise an active layer;

wherein a respective one of the plurality of color filter blocks is formed to comprise a plurality of plasmonic nanostructures made of a semiconductor material; and a first color filter block corresponding to a subpixel of a first color has a first arrangement of nanostructures;

a second color filter block corresponding to a subpixel of a second color; the second color being different from the first color has a second arrangement of nanostructures;

the first arrangement of nanostructures is different from the second arrangement of nanostructures;

the second color is different from the first color; and the plasmonic color filter layer and the active layer are formed in a same layer and are made of a same material.

19. The method of claim 18, wherein the plurality of plasmonic nanostructures in the respective one of the plurality of color filter blocks are formed to have a periodic arrangement of repeating plasmonic nanostructures.

20. The method of claim 18, comprising:
forming a buffer layer on the base substrate;
forming an amorphous silicon layer on a side of the buffer layer distal to the base substrate;
crystallizing the amorphous silicon layer to form a polycrystalline silicon layer; and
patterning the polycrystalline silicon layer to form the plasmonic color filter layer and the active layer.

* * * * *